United States Patent

Wakiya et al.

[11] Patent Number: 5,863,710
[45] Date of Patent: Jan. 26, 1999

[54] DEVELOPER SOLUTION FOR PHOTOLITHOGRAPHIC PATTERNING

[75] Inventors: Kazumasa Wakiya, Fujisawa; Masakazu Kobayashi; Toshimasa Nakayama, both of Chigasaki, all of Japan

[73] Assignee: Tokyo Ohka Kogyo Co., Ltd., Japan

[21] Appl. No.: 869,342

[22] Filed: Jun. 5, 1997

[51] Int. Cl.$^6$ ....................................................... G03F 7/30
[52] U.S. Cl. .......................... 430/331; 430/294; 430/311; 430/314; 430/319; 430/325; 510/171; 510/176
[58] Field of Search ............................. 430/331; 510/171, 510/176

[56] References Cited

U.S. PATENT DOCUMENTS 4,822,723  4/1989  Phillon ...................................... 430/331
5,252,436  10/1993 Binder et al. ............................ 430/331

FOREIGN PATENT DOCUMENTS 64-19344   1/1989   Japan .

*Primary Examiner*—Hoa Van Le
*Attorney, Agent, or Firm*—Wenderoth, Lind & Ponack, L.L.P.

[57] ABSTRACT

Proposed is an aqueous alkaline developer solution used in the development treatment of a photoresist layer, especially, formed on an aluminum surface of a substrate. Different from conventional aqueous alkaline developer solutions which attack the aluminum surface in the development treatment to cause discoloration or corrosion, the inventive developer solution is free from such troubles by virtue of the specific formulation including, besides 2 to 10% by weight of tetramethylammonium hydroxide as the effective developing ingredient, 20 to 50% by weight of a polyhydric alcohol which is preferably glycerin.

6 Claims, No Drawings

DEVELOPER SOLUTION FOR PHOTOLITHOGRAPHIC PATTERNING

BACKGROUND OF THE INVENTION

The present invention relates to a developer solution for a photoresist layer used in photolithographic patterning. More particularly, the invention relates to a novel aqueous alkaline developer solution for a photoresist layer on a metallic substrate surface capable of exhibiting an excellent anti-corrosive effect to the metallic surface and causing no troubles of exfoliation of the upper metallic layer from the substrate surface which is laminated with an overlayer of a metal of different kind from the metal of the substrate so as to be useful in the manufacturing process of various kinds of semiconductor devices and liquid crystal display panels.

The method of photolithographic patterning is a well established technology in the manufacturing process of various kinds of semiconductor devices and liquid crystal display panels in which the etching treatment or diffusion treatment is preceded, with an object to selectively protect the substrate surface against the treatment, by coating of the substrate surface with a photosensitive resist composition to form a photoresist layer which is pattern-wise exposed to actinic rays such as ultraviolet light, deep ultraviolet light, excimer laser beams, X-rays and electron beams followed by a development treatment of the resist layer to pattern-wise dissolve away the resist layer.

The developer solution used in the above mentioned development treatment of the photoresist layer is usually an aqueous alkaline solution containing a water-soluble organic base free from metallic constituents which are detrimental against performance of the semiconductor devices or liquid crystal display panels. Examples of such a metal-free organic base include tetramethylammonium hydroxide disclosed in IBM Technical Disclosure Bulletin, volume 3, No. 7, page 2009 (1970) and trimethyl(2-hydroxyethyl)ammonium hydroxide disclosed in U.S. Pat. No. 4,238,661.

Proposals and attempts have been made heretofore to admix the above mentioned organic base-containing aqueous developer solution with various kinds of additives with an object to improve the developability of the developer solution. For example, Japanese Patent Kokai 58-9143 teaches admixture of a specific quaternary ammonium compound which serves as a surface active agent. Japanese Patent Kokai 64-19344 discloses an aqueous developer solution containing from 0.2 to 3.5% by weight of tetramethylammonium hydroxide and from 0.2 to 10% by weight of a polyhydric alcohol, the balance being water. Such an aqueous developer solution is widely employed as a general-purpose developer solution by virtue of easiness in storage and waste disposal along with safety from fire hazards.

It is sometimes the case that the substrate used in the manufacture of semiconductor devices and liquid crystal display panels is a silicon wafer or a glass plate provided on the surface with a layer of a metal such as aluminum to serve as the electric circuit pattern. When such a substrate having a metallic layer is subjected to the photolithographic patterning process to form a patterned metallic layer, a trouble is sometimes encountered that the aqueous alkaline developer solution attacks the metallic layer to cause corrosion of the metallic layer. A recently highlighted substrate as a display for a thin-film transistor (TFT) is a glass plate which is provided with a transparent electroconductive film of indium oxide or mixed oxide of indium and tin called ITO and, further thereon, with a vapor-deposited aluminum film as an electroconductive layer which is patterned photolithographically. When the development treatment is undertaken for a substrate having a layered structure of different kinds of metals by using a conventional aqueous alkaline developer solution, troubles are sometimes unavoidable that exfoliation of the aluminum film takes place or the aluminum film is partly lifted off the underlying transparent electroconductive film by the gas evolved at the interface of the layers eventually to cause bursting of the aluminum film. It is eagerly desired accordingly to develop a novel aqueous developer solution free from these problems and disadvantages.

SUMMARY OF THE INVENTION

The present invention accordingly has an object to provide a novel and improved aqueous alkaline developer solution for the development treatment of a photoresist layer in the photolithographic patterning works.

Thus, the aqueous alkaline developer solution for photolithographic patterning provided by the invention is a uniform solution which comprises:

(a) from 2 to 10% by weight of an organic base compound; and (b) from 20 to 50% by weight of a polyhydric alcohol, the balance being water.

The organic base compound as the component (a), which should be free from metallic constituents, is preferably tetramethylammonium hydroxide and the polyhydric alcohol as the component (b) is preferably glycerin, propyleneglycol or ethyleneglycol, of which glycerin is more preferable.

DETAILED DESCRIPTION OF THE PREFERRED EMBODIMENTS

The organic base compound free from metallic constituents as the component (a) in the inventive developer solution is exemplified by amine compounds including primary, secondary and tertiary amines having a straightly linear, branched or cyclic substituent such as diaminoalkanes, e.g., 1,3-diaminopropane, aryl amines, e.g., 4,4'-diaminodiphenyl amine and heterocyclic base compounds having a ring structure consisting of 3 to 5 carbon atoms and 1 or 2 hetero atoms of oxygen, nitrogen or sulfur, e.g., pyrrole, pyrrolidine, pyrrolidone, pyridine, morpholine, pyrazine, piperidine, oxazole and thiazole. Further, quaternary lower-alkylammonium hydroxides are suitable as the component (a). Examples of suitable quaternary ammonium hydroxides include tetramethylammonium hydroxide, tetraethylammonium hydroxide, tetrapropylammonium hydroxide, trimethyl(2-hydroxyethyl)ammonium hydroxide, triethyl(2-hydroxyethyl)ammonium hydroxide, tripropyl(2-hydroxyethyl)ammonium hydroxide and trimethyl(1-hydroxypropyl)ammonium hydroxide, of which tetramethylammonium hydroxide is preferred. These organic base compounds can be used either singly or as a combination of two kinds or more according to need.

The concentration of the organic base compound in the inventive developer solution is, though dependent on various factors, in the range from 2 to 10% by weight or, preferably, from 3.5 to 7.0% by weight. When the concentration thereof is too low, the developing power of the developer solution is unduly low not to give a patterned resist layer while, when the concentration thereof is too high, the resist layer is dissolved away by the developer solution even from the areas where the resist layer should remain undissolved or the thickness reduction of the resist layer is so large that no good patterned resist layer can be obtained by the development treatment.

The medium to dissolve the above mentioned organic base compound as the effective developing ingredient is a mixture of water and a polyhydric alcohol which is selected from the group consisting of glycerin, propyleneglycol and ethyleneglycol of which glycerin is preferred because of the excellent anti-corrosive effect on metallic surfaces even when the concentration thereof is relatively low. The polyhydric alcohols can be used either singly or as a combination of two kinds or more according to need.

The amount of the polyhydric alcohol in the inventive developer solution is in the range from 20 to 50% by weight. When the concentration of the polyhydric alcohol is too low, no practical anti-corrosive effect can be obtained while, when the concentration thereof is too high, film thickness reduction of the resist layer is increased in the areas where the resist layer should remain undissolved so that degradation is resulted in the quality of the patterned resist layer.

It is of course optional that the inventive developer solution consisting of the organic base compound, polyhydric alcohol and water is further admixed with various kinds of known additives such as surface active agents, lubricants, wetting agents, stabilizers, dissolution aids and the like each in a limited amount.

The inventive developer solution exhibits high anti-corrosive effect to various metals including aluminum, copper, alloys of aluminum and copper, tantalum and the like and a patterned resist layer can be obtained even on a metallic surface without the troubles due to corrosion of the metallic surface so that an excellently patterned metallic layer can be obtained. Further, an aluminum overlayer formed on a transparent electroconductive layer of indium oxide or indium-tin oxide to form a layered structure can also be patterned without the troubles due to exfoliation or bursting by gas evolution.

The developer solution of the invention is applicable to the development treatment of any photoresist compositions including negative-working and positive-working ones provided that the photoresist layer is developable with an aqueous alkaline developer solution. Particular types of the photoresist compositions to which th inventive developer solution is applicable include positive-working photoresist compositions comprising a novolak resin and a naphthoquinone diazide compound, positive-working photoresist compositions comprising an acid-generating compound capable of releasing an acid by exposure to actinic rays, a compound imparted with increased solubility in an aqueous alkaline solution by decomposition with an acid and an alkali-soluble resin, positive-working photoresist compositions comprising an acid-generating compound capable of releasing an acid by exposure to actinic rays and an alkali-soluble resin having substituent groups capable of being imparted with increased solubility in an aqueous alkaline solution by decomposition with an acid and negative-working photoresist compositions comprising an acid-generating agent, an acid-crosslinkable compound and an alkali-soluble resin.

In the following, the developer solution of the invention is described in more detail by way of Examples, in which the terms of "%" and "parts" in the formulation of the developer solutions and photoresist compositions always refer to "% by weight" and "parts by weight", respectively.

EXAMPLE 1

An aqueous developer solution was prepared by dissolving tetramethylammonium hydroxide, referred to as TMAH hereinafter, and glycerin in water in concentrations of 3.5% and 20%, respectively. This developer solution was subjected to a corrosion test of aluminum by dipping, in 200 ml of the developer solution kept at 23° C., a 2 cm by 3 cm glass plate having a vapor-deposited aluminum film of 100 nm thickness on one of the surfaces to record the length of time taken for complete disappearance of the aluminum film by dissolution.

Further, a 2 cm by 3 cm glass plate having an ITO film on the surface and a vapor-deposited aluminum film of 40 nm thickness on the ITO film was dipped in 200 ml of the developer solution at 23° C. for 10 minutes to undertake visual inspection of the condition of the aluminum film. The results were recorded in two ratings of: A for absence of any lifted areas of the aluminum film off the ITO film; and B for occurrence of exfoliation or lifting of the aluminum film.

The results of these tests are summarized in Table 1 below.

EXAMPLES 2 TO 8 AND COMPARATIVE EXAMPLES 1 TO 4

The experimental procedure in each of these Examples and Comparative Examples was substantially the same as in Example 1 excepting for modification of the formulation of the developer solution as shown in Table 1, in which the polyhydric alcohols are referred to as "G" for glycerin, "EG" for ethyleneglycol and "PG" for propyleneglycol.

The results of the testings are shown in Table 1.

TABLE 1

| | | Developer solution | | | Length of time for complete disappearance of aluminum film, minutes | Condition of aluminum film |
|---|---|---|---|---|---|---|
| | | TMAH, % | Polyhydric alcohol Kind | % | | |
| Example | 1 | 3.5 | G | 20 | 45 | A |
| | 2 | 4.0 | G | 30 | 100< | A |
| | 3 | 4.5 | G | 30 | 100< | A |
| | 4 | 5.5 | G | 45 | 100< | A |
| | 5 | 4.0 | EG | 30 | 60 | A |
| | 6 | 5.5 | EG | 45 | 100< | A |
| | 7 | 3.5 | PG | 40 | 60 | A |
| | 8 | 6.0 | PG | 50 | 100< | A |
| Comparative Example | 1 | 2.38 | — | — | 10 | B |
| | 2 | 4.0 | G | 10 | 25 | B |
| | 3 | 4.0 | EG | 10 | 20 | B |
| | 4 | 4.0 | G | 15 | 30 | B |

EXAMPLE 9

A positive-working photoresist composition was prepared by dissolving 100 parts of a cresol novolak resin and 30 parts of 2,3,4-trihydroxybenzophenone ester of naphthoquinone-1,2-diazido-5-sulfonic acid in 390 parts of ethyleneglycol monoethyl ether acetate followed by filtration of the thus obtained solution through a membrane filter of 0.2 $\mu$m pore diameter.

A 4-inch silicon wafer having a vapor-deposited aluminum film was coated with the photoresist solution prepared in the above described manner by using a spinner followed by drying on a hot plate at 110° C. for 90 seconds to give a photoresist layer of 1.35 $\mu$m thickness which was patternwise exposed to ultraviolet light through a test chart photomask on a minifying projection exposure machine (Model NSR-1505G4D, manufactured by Nikon Co.).

The photoresist layer after the pattern-wise exposure was subjected to a development treatment by using the developer solution prepared in Example 2 at 23° C. for 65 seconds followed by rinse in a running stream of pure water for 30 seconds and drying to give a patterned resist layer. A visual inspection was undertaken for the condition of the thus patterned resist layer and the exposed aluminum surface to find that the resist layer was excellently patterned with the exposed aluminum surface absolutely free from discoloration and corrosion.

COMPARATIVE EXAMPLE 5

The same experimental procedure as in Example 9 was undertaken excepting for the replacement of the developer solution prepared in Example 2 with the solution prepared in Comparative Example 2. The result of the visual inspection of the patterned resist layer was that discoloration and spotwise corrosion were detected on the exposed aluminum surface although good patterning was obtained in the resist layer.

COMPARATIVE EXAMPLE 6

The same experimental procedure as in Example 9 was undertaken excepting for the replacement of the developer solution prepared in Example 2 with the aqueous solution prepared by dissolving tetramethylammonium hydroxide and glycerin in water in concentrations of 4.0% and 60%, respectively. The result was that the film thickness reduction of the obtained resist layer was so large in the unexposed areas that no acceptably patterned resist layer could be obtained.

What is claimed is:

1. An aqueous alkaline developer solution for photolithographic patterning of a photoresist layer which comprises, in the form of a uniform solution:
    (a) from 2 to 10% by weight of an organic base compound; and
    (b) from 20 to 50% by weight of a polyhydric alcohol selected from the group consisting of glycerin, propyleneglycol and ethyleneglycol, the balance being water.

2. The developer solution as claimed in claim 1 in which the organic base compound as the component (a) is tetramethylammonium hydroxide.

3. The developer solution as claimed in claim 1 in which the polyhydric alcohol as the component (b) is glycerin.

4. The developer solution as claimed in claim 1 in which the amount of the organic base compound is in the range from 3.5 to 7.0% by weight.

5. A method for patterning of a photoresist layer formed on a metallic surface of a substrate which comprises the steps of:
    (A) exposing the photoresist layer pattern-wise to actinic rays to form a latent image of the pattern; and
    (B) developing the latent image of the photoresist layer with an aqueous alkaline developer solution comprising, in the form of a uniform solution,
    (a) from 2 to 10% by weight of an organic base compound; and
    (b) from 20 to 50% by weight of a polyhydric alcohol selected from the group consisting of glycerin, propyleneglycol and ethyleneglycol, the balance being water, to selectively dissolve away the photoresist layer.

6. A method for patterning of a photoresist layer formed on the surface of an aluminum film which is formed by vapor-deposition on the surface of a layer of indium oxide or an indium-tin oxide which comprises the steps of:
    (A) exposing the photoresist layer pattern-wise to actinic rays to form a latent image of the pattern; and
    (B) developing the latent image of the photoresist layer with an aqueous alkaline developer solution comprising, in the form of a uniform solution,
    (a) from 2 to 10% by weight of an organic base compound; and
    (b) from 20 to 50% by weight of a polyhydric alcohol selected from the group consisting of glycerin, propyleneglycol and ethyleneglycol, the balance being water, to selectively dissolve away the photoresist layer.

* * * * *